United States Patent
Cho et al.

(10) Patent No.: US 11,532,541 B2
(45) Date of Patent: Dec. 20, 2022

(54) SEMICONDUCTOR PACKAGE HAVING A SOLDERABLE CONTACT PAD FORMED BY A LOAD TERMINAL BOND PAD OF A POWER SEMICONDUCTOR DIE

(71) Applicant: Infineon Technologies AG, Neubiberg (DE)

(72) Inventors: Eung San Cho, Torrance, CA (US); Petteri Palm, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 123 days.

(21) Appl. No.: 16/774,357

(22) Filed: Jan. 28, 2020

(65) Prior Publication Data

US 2021/0233837 A1   Jul. 29, 2021

(51) Int. Cl.
*H01L 23/498* (2006.01)
*H01L 23/492* (2006.01)
(Continued)

(52) U.S. Cl.
CPC .. *H01L 23/49827* (2013.01); *H01L 21/76871* (2013.01); *H01L 23/492* (2013.01);
(Continued)

(58) Field of Classification Search
None
See application file for complete search history.

(56) References Cited

U.S. PATENT DOCUMENTS

| 4,646,129 A | 2/1987 | Yerman et al. |
| 7,271,470 B1 | 9/2007 | Otremba |

(Continued)

FOREIGN PATENT DOCUMENTS

| CN | 109727969 A | 5/2019 |
| DE | 102017105330 A1 | 9/2018 |
| EP | 3376539 A1 | 9/2018 |

OTHER PUBLICATIONS

Dinkel, Markus, et al., "Semiconductor Package and Method of Fabricating a Semiconductor Package", U.S. Appl. No. 16/668,038, filed Oct. 30, 2019.
(Continued)

*Primary Examiner* — Telly D Green
(74) *Attorney, Agent, or Firm* — Murphy, Bilak & Homiller, PLLC

(57) ABSTRACT

A semiconductor package includes: an insulating substrate having opposing first and second main sides; a power semiconductor die embedded in, and thinner than or a same thickness as, the substrate, and including a first load terminal bond pad at a first side which faces a same direction as the substrate first main side, a second load terminal bond pad at a second side which faces a same direction as the substrate second main side, and a control terminal bond pad; electrically conductive first vias extending through the substrate in a periphery region; a first metallization connecting the first load terminal bond pad to the first vias at the substrate first main side; solderable first contact pads at the substrate second main side and formed by the first vias; and a solderable second contact pad at the substrate second main side and formed by the second load terminal die bond pad.

17 Claims, 12 Drawing Sheets

(51) Int. Cl.
*H01L 23/495* (2006.01)
*H01L 23/00* (2006.01)
*H01L 21/768* (2006.01)

(52) U.S. Cl.
CPC ........ *H01L 23/49568* (2013.01); *H01L 24/05* (2013.01); *H01L 2924/15747* (2013.01)

(56) References Cited

U.S. PATENT DOCUMENTS

| | | | |
|---|---|---|---|
| 7,315,081 B2 | 1/2008 | Standing | |
| 7,757,392 B2 | 7/2010 | Otremba | |
| 10,170,428 B2* | 1/2019 | Pietambaram | H01L 24/17 |
| 10,192,795 B2* | 1/2019 | Mori | H01L 22/30 |
| 10,617,012 B2* | 4/2020 | Zluc | H05K 3/22 |
| 11,043,409 B2* | 6/2021 | Palm | H01L 24/19 |
| 11,069,667 B2* | 7/2021 | Gani | G01S 17/04 |
| 2001/0048156 A1 | 12/2001 | Fukuizumi | |
| 2006/0214186 A1* | 9/2006 | Hamidi | H01L 23/24 |
| | | | 257/177 |
| 2007/0266558 A1 | 11/2007 | Otremba | |
| 2010/0044842 A1 | 2/2010 | Mengel et al. | |
| 2012/0235293 A1 | 9/2012 | Jones et al. | |
| 2013/0292684 A1* | 11/2013 | Nikitin | H01L 23/50 |
| | | | 257/76 |
| 2014/0110788 A1 | 4/2014 | Cho et al. | |
| 2014/0217576 A1 | 8/2014 | Im et al. | |
| 2015/0001699 A1 | 1/2015 | Funatsu et al. | |
| 2015/0255380 A1* | 9/2015 | Chen | H01L 23/49575 |
| | | | 361/707 |
| 2017/0221798 A1 | 8/2017 | Cho | |
| 2017/0287886 A1* | 10/2017 | Gani | H01L 23/481 |
| 2018/0054120 A1 | 2/2018 | Cho | |
| 2018/0269146 A1* | 9/2018 | Palm | H01L 21/4846 |
| 2019/0273017 A1* | 9/2019 | Palm | H01L 23/3128 |

OTHER PUBLICATIONS

Peinhopf, Wolfgang, "Cooling concepts for CanPAK(TM)* package", Infineon Technologies AG, Edition Feb. 28, 2011, Actual Release: Rev.1.0, accessed online at https://www.infineon.com/dgdl/Infineon-CanPAK_cooling_concepts-AN-v01_00-EN.pdf?fileld=db3a30432e5d3808012e703377015fe9 on Jan. 28, 2020.

* cited by examiner

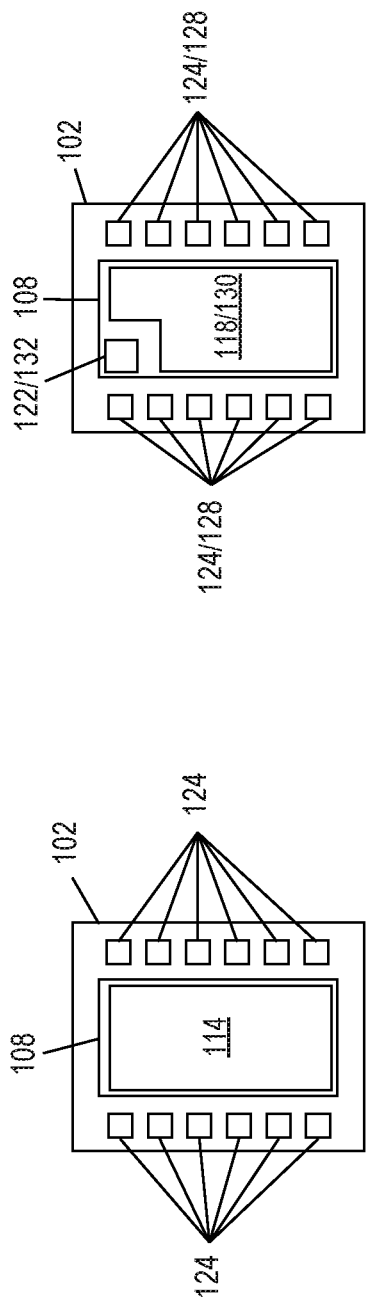
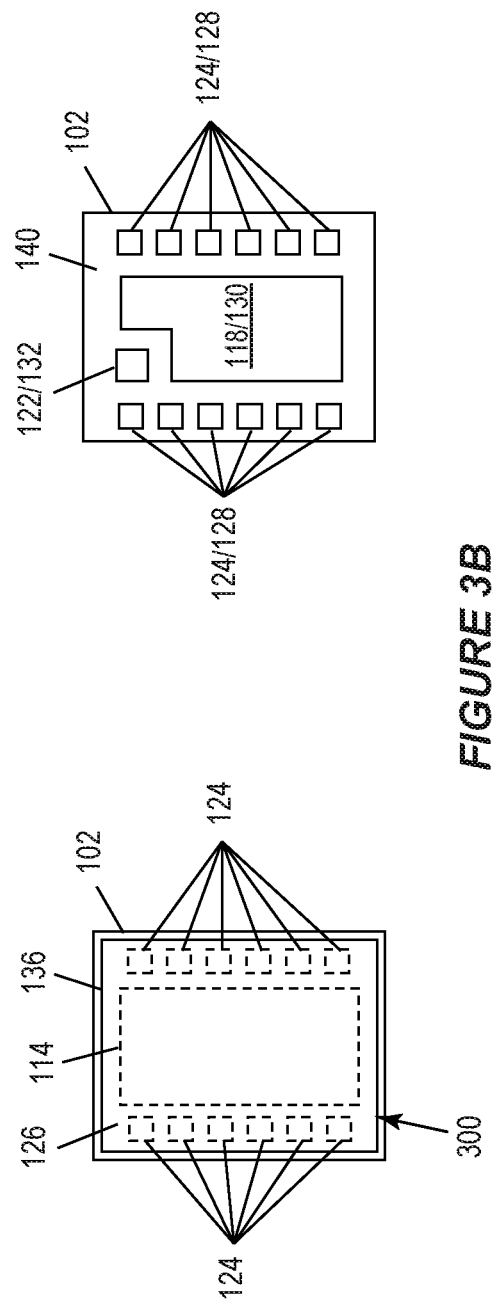
FIGURE 3A
FIGURE 3B

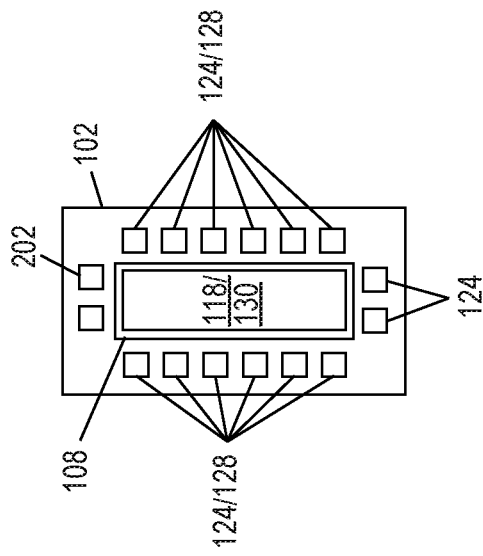
*FIGURE 4A*
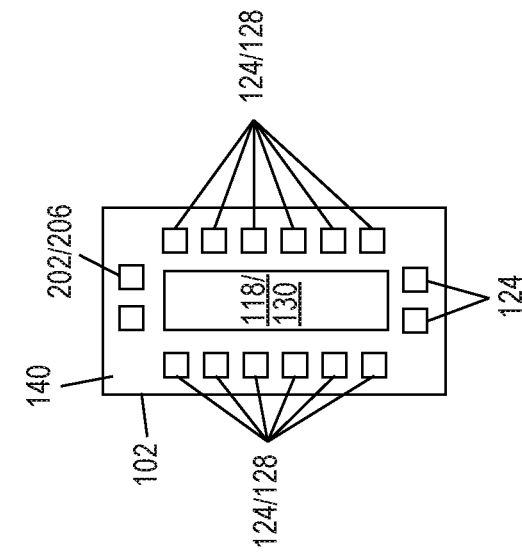
*FIGURE 4B*
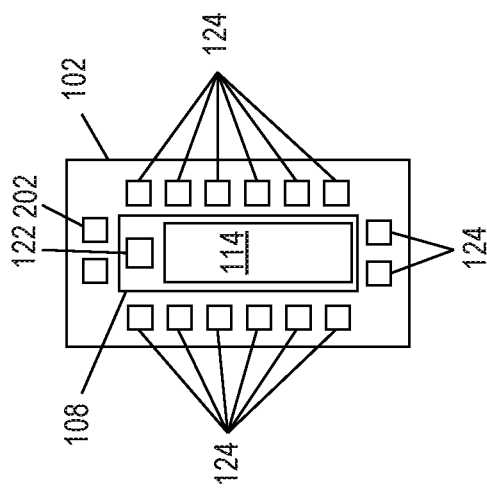
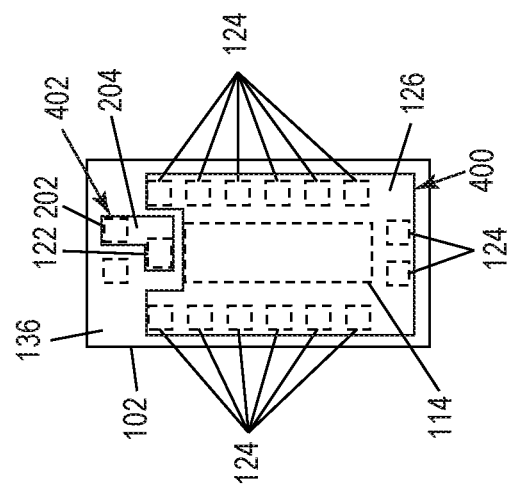

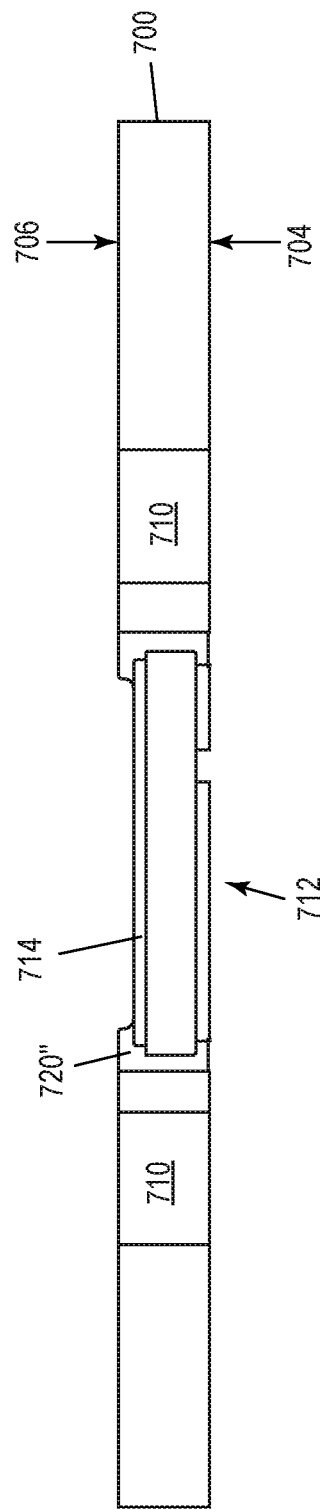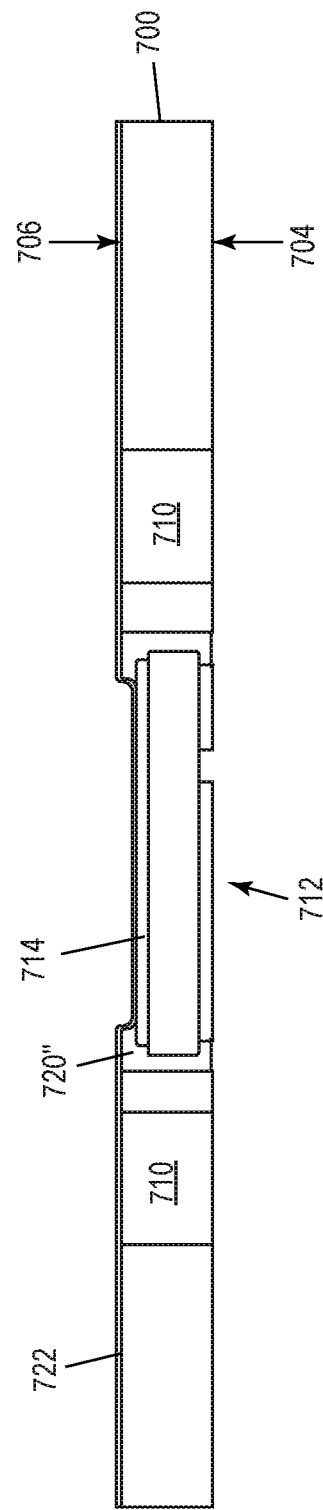

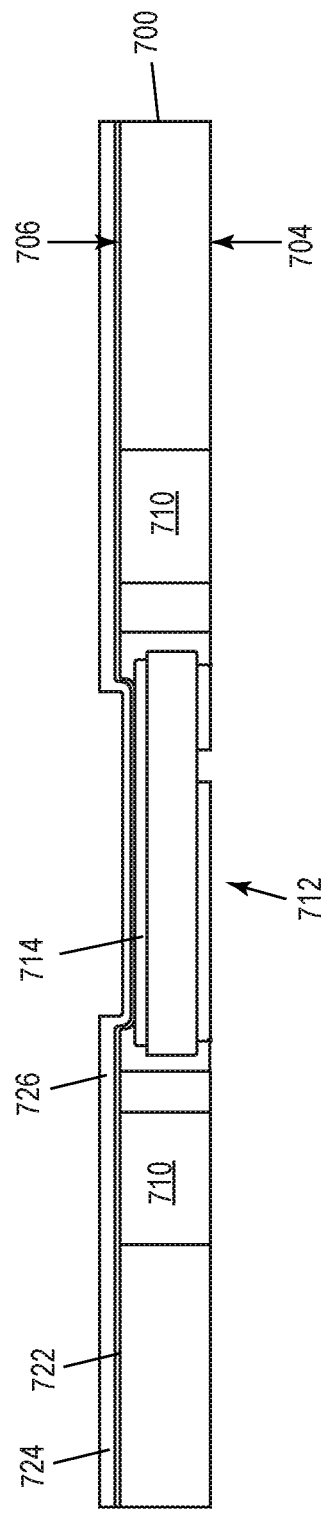
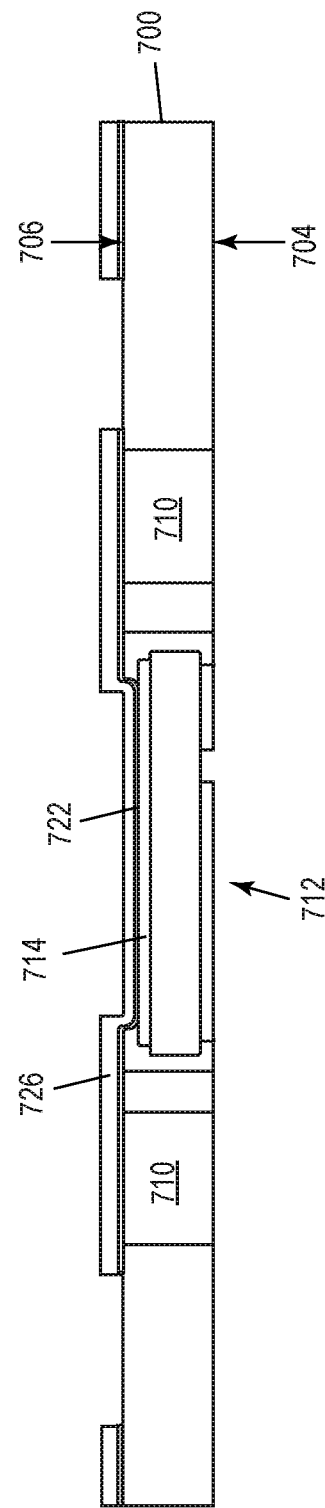
FIGURE 7G
FIGURE 7H

SEMICONDUCTOR PACKAGE HAVING A SOLDERABLE CONTACT PAD FORMED BY A LOAD TERMINAL BOND PAD OF A POWER SEMICONDUCTOR DIE

BACKGROUND

Cooling capability is a disadvantage for SMD (surface mount device) based power electronics. However, SMD-based systems provide high efficiency and are thus widely used. Some power SMD package solutions provide a low thermal resistance to the top and bottom sides of the package and no longer use bond wire or clip interconnects, but instead use solder bumps for source and gate connections. The drain connection is formed by a plated copper can (lid) which is bonded to the drain side of the power semiconductor die. The can/lid provides a low thermal resistance to the top side of the package and is well-suited for cooling through the top side of the package, thereby providing a double-sided cooling solution.

However, the can/lid approach requires a relatively large gate pad size which reduces the active area of the power semiconductor device and therefore increases die cost and lowers overall efficiency. In addition, the can/lid approach does not easily support thin semiconductor dies (e.g. 40 μm to 60 μm thick or even thinner) due to bond line thickness issues which arise when thermal material creeps up the sidewall of a thin power semiconductor die. Excessive creepage may result in electrical problems, which is difficult to avoid in the case of thin semiconductor dies.

Thus, there is a need for an improved SMD-based power semiconductor package and related methods of manufacture.

SUMMARY

According to an embodiment of a semiconductor package, the semiconductor package comprises: an insulating substrate having a first main side and a second main side opposite the first main side; a power semiconductor die embedded in, and thinner than or a same thickness as, the insulating substrate, the power semiconductor die comprising a first load terminal bond pad at a first side which faces a same direction as the first main side of the insulating substrate, a second load terminal bond pad at a second side which faces a same direction as the second main side of the insulating substrate, and a control terminal bond pad at the first side or the second side; electrically conductive first vias extending through the insulating substrate in a periphery region which laterally surrounds the power semiconductor die; a first metallization connecting the first load terminal bond pad of the power semiconductor die to the first vias at the first main side of the insulating substrate; solderable first contact pads at the second main side of the insulating substrate and formed by the first vias; and a solderable second contact pad at the second main side of the insulating substrate and formed by the second load terminal bond pad of the power semiconductor die.

According to an embodiment of a method of producing a semiconductor package, the method comprises: embedding a power semiconductor die in an insulating substrate, the insulating substrate having a first main side and a second main side opposite the first main side, the power semiconductor die being thinner than or a same thickness as the insulating substrate and comprising a first load terminal bond pad at a first side which faces a same direction as the first main side of the insulating substrate, a second load terminal bond pad at a second side which faces a same direction as the second main side of the insulating substrate, and a control terminal bond pad at the first side or the second side; and forming a first metallization at the first main side of the insulating substrate, the first metallization connecting the first load terminal bond pad of the power semiconductor die to electrically conductive first vias which extend through the insulating substrate in a periphery region which laterally surrounds the power semiconductor die, wherein the first vias form solderable first contact pads at the second main side of the insulating substrate, wherein the second load terminal bond pad of the power semiconductor die forms a solderable second contact pad at the second main side of the insulating substrate.

According to an embodiment of a method of producing a plurality of semiconductor packages, the method comprises: adhering a core insulating panel having a plurality of openings to a temporary bonding tape at a second main side of the core insulating panel opposite a first main side; inserting a power semiconductor die in each opening of the core insulating panel, each power semiconductor die being thinner than or a same thickness as the core insulating panel and comprising a first load terminal bond pad at a first side which faces a same direction as the first main side of the core insulating panel, a second load terminal bond pad at a second side which faces a same direction as the second main side of the core insulating panel, and a control terminal bond pad at the first side or the second side, wherein each power semiconductor die adheres to the temporary bonding tape at the second side of the power semiconductor die; forming a first metallization layer at the first main side of the core insulating panel, the first metallization layer being patterned into a plurality of first metallizations, each first metallization being associated with one of the power semiconductor dies and connecting the first load terminal bond pad of the power semiconductor die to respective electrically conductive first vias which extend through the core insulating panel in a periphery region which laterally surrounds the power semiconductor die; and singulating the core insulating panel into a plurality of packages, wherein for each package the first vias included in the package form solderable first contact pads at the second main side of the singulated core insulating panel and the second load terminal bond pad of the power semiconductor die included in the package forms a solderable second contact pad at the second main side of the singulated core insulating panel.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A and 3B illustrate an embodiment of a method of producing the semiconductor package shown in FIG. 1.

FIGS. 4A and 4B illustrate an embodiment of a method of producing the semiconductor package shown in FIG. 2.

FIGS. 7A through 7I illustrate respective cross-sectional views of an embodiment of a method of batch producing semiconductor package.

DETAILED DESCRIPTION

The embodiments described provide a semiconductor package having one or more solderable contact pads formed by at least one terminal bond pad of a power semiconductor die, and methods of manufacturing thereof. The semiconductor package has increased thermal dissipation, smaller form factor, provides direct pad contact between die and mounting surface, and provides gate terminal routing. The methods described herein are process-flow compatible with large panels typically used in PCB (printed circuit board) processing and provide lower cost scale. The package also has improved thermal performance at the package topside. Instead of solder between the die and topside metallization, the connection may be a direct copper-to-copper connection. The package footprint can be standardized between different die sizes, since the surface of the insulating substrate body of the package can be used to extend/rout the source/emitter (or drain/collector) and gate pad connections in the case of a power semiconductor transistor device.

Figure 1:
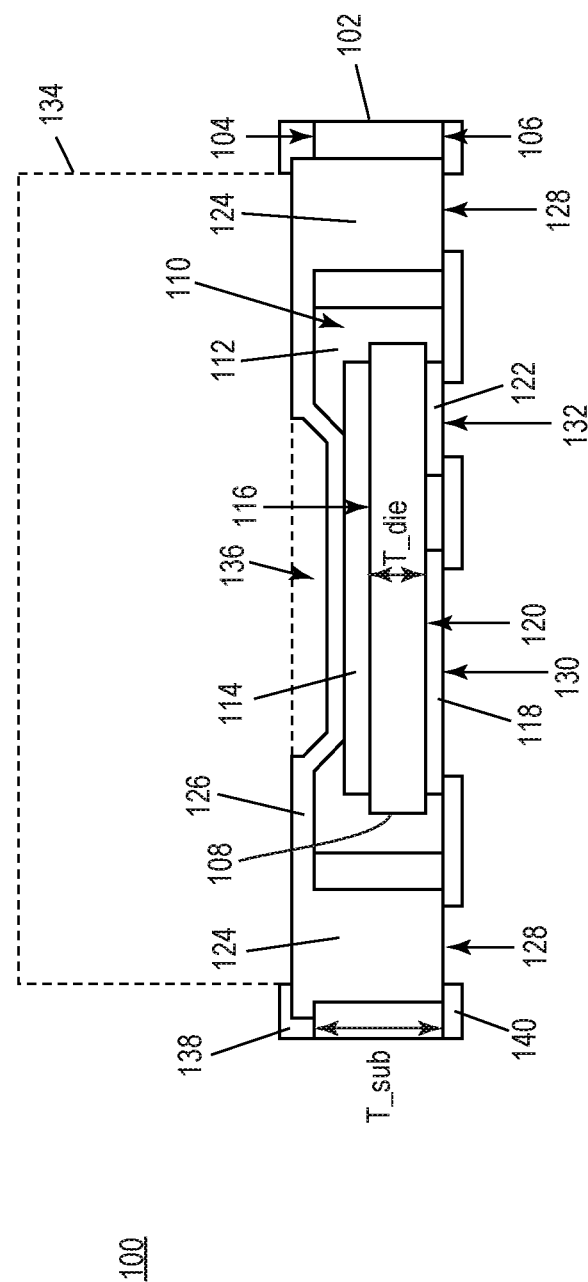
FIG. 1 illustrates a cross-sectional view of an embodiment of a semiconductor package.

FIG. 1 illustrates a cross-sectional view of an embodiment of a semiconductor package 100. The semiconductor package 100 includes an insulating substrate 102 having a first main side 104 and a second main side 106 opposite the first main side 104. The insulating substrate 102 may be a laminate such as a PCB substrate, etc. The package 100 also includes a power semiconductor die 108 embedded in, and thinner than or a same thickness as, the insulating substrate 102. That is, the thickness T_sub of the insulating substrate 102 is the same as or greater than the thickness T_die of the power semiconductor die 108, thereby eliminating bond line thickness issues associated with thin semiconductor dies. Accordingly, the power semiconductor die 108 embedded in the insulating substrate 102 may be relatively thin, e.g., T_die may be in a range of 40 µm to 60 µm or even less.

In one embodiment, the power semiconductor die 108 is positioned in an opening 110 in the insulating substrate 102 and the opening 110 is at least partly filled with an insulating material 112 such as an epoxy, resin, etc. The insulating substrate 102 with the opening 110 and the insulating material 112 that at least partly fills the opening 110 may be made of the same material or of different materials. For example, the insulating substrate 102 with the opening 110 may comprise glass fibres embedded in an epoxy and the insulating material 112 that at least partly fills the opening 110 may comprise a resin. In another example, both the insulating substrate 102 with the opening 110 and the insulating material 112 that at least partly fills the opening 110 may be a resin material. These are just a few examples for the composition of the insulating substrate 102 and insulating material 112, and still other material combinations are possible.

The power semiconductor die 108 embedded in the insulating substrate 102 has a first load terminal bond pad 114 at a first side 116 of the die 108 and which faces the same direction as the first main side 104 of the insulating substrate 102. The power semiconductor die 108 also has a second load terminal bond pad 118 at a second side 120 of the die 108 and which faces the same direction as the second main side 106 of the insulating substrate 102. According to the embodiment illustrated in FIG. 1, the power semiconductor die 108 further has a control terminal bond pad 122 at the second side 120 of the die 108.

The first load terminal bond pad 114 of the power semiconductor die 108 may be a drain terminal bond pad and the second load terminal bond pad 118 of the die 108 may be a source terminal bond pad, e.g., in the case of a power MOSFET (metal-oxide-semiconductor field-effect transistor) device, HEMT (high-electron mobility transistor) device, etc. The first load terminal bond pad 114 of the power semiconductor die 108 instead may be a collector terminal bond pad and the second load terminal bond pad 118 of the die 108 may be an emitter terminal bond pad, e.g., in the case of an IGBT (insulated-gate bipolar transistor) device. In each example, the control terminal bond pad 122 at the second side 120 of the power semiconductor die 108 may be a gate terminal bond pad.

Regardless of the type of power semiconductor die 108 embedded in the insulating substrate 102, the semiconductor package 100 also includes electrically conductive first vias 124 such as plated through holes, copper vias, metal blocks, etc. extending through the insulating substrate 102 in a periphery region which laterally surrounds the power semiconductor die 108. The semiconductor package 100 further includes a first metallization 126 such as a copper metallization connecting the first load terminal bond pad 114 of the power semiconductor die 108 to the first vias 124 at the first main side 104 of the insulating substrate 102.

In one embodiment, the first vias 124, the first metallization 126 and the first load terminal bond pad 114 of the power semiconductor die 108 each comprise copper. The second load terminal bond pad 118 and the control terminal bond pad 122 of the power semiconductor die 108 also may each comprise copper. Other electrically conductive materials may be used for the first vias 124, the first metallization 126 and the terminal bond pads 114, 118, 122 of the power semiconductor die 108. In general, any metal or metal compound such as Cu, NiPdAu, etc. may be used for the first load terminal bond pad 114 at the first side 116 of the power semiconductor die 108. For the terminal bond pads 118, 122 at the second side 120 of the power semiconductor die 108, the metal or metal compound used should be solderable, e.g., Cu. The term "solderable" as used herein means an adequate soldered joint can be made to that material. For example, the solderable contact pads described herein may include standard leaded or lead-free solder materials or alloys used in electronics manufacturing and containing at least one of the following materials: Sn, Pb, Sb, Bi, Ag, Cu, Zn, and/or In.

Solderable first contact pads 128 at the second main side 106 of the insulating substrate 102 are formed by the first vias 124 which extend through the insulating substrate 102. In one embodiment, standard pre-plated vias are used but made wide/large enough so that the first vias 124 have sufficient surface contact area for use as final/direct pads 128 at the second main side 106 of the insulating substrate 102.

In the example given above of the first load terminal bond pad 114 of the power semiconductor die 108 being a drain (or collector) terminal bond pad, this means that the first vias 124 can be used as final/direct pads 128 for providing the drain (or collector) connection at the second main side 106 of the insulating substrate 102. If the first load terminal bond pad 114 of the power semiconductor die 108 is instead a source (or emitter) terminal bond pad, the first vias 124 can be used as final/direct pads 128 for providing the source (or emitter) connection at the second main side 106 of the insulating substrate 102.

A solderable second contact pad 130 at the second main side 106 of the insulating substrate 102 is formed by the second load terminal bond pad 118 of the power semiconductor die 108, and a solderable third contact pad 132 at the second main side 106 of the insulating substrate 102 is formed by the control terminal bond pad 122 of the die 108 in FIG. 1. Accordingly, at least two terminal bond pads 118, 122 of the power semiconductor die 108 form some of the final I/O pads of the semiconductor package 100 according to the embodiment illustrated in FIG. 1, whereas the first vias 124 form additional final I/O pads of the package.

In one embodiment, at the second main side 106 of the insulating substrate 102, the solderable second contact pad 130 formed by the second load terminal bond pad 118 of the power semiconductor die 108 is coplanar with the solderable first contact pads 128 formed by the first vias 124. The solderable third contact pad 132 formed by the control terminal bond pad 122 of the power semiconductor die 108 may also be coplanar with the solderable first contact pads 128 formed by the first vias 124 at the second main side 106 of the insulating substrate 102.

All electrical connections for the power semiconductor die 108 are provided at the second main side 106 of the insulating substrate 102 in the form of respective solderable contact pads 128, 130, 132, giving the semiconductor package 100 an SMD configuration. The semiconductor package 100 may be cooled at the second main side 106 of the insulating substrate 102, e.g., through the board/substrate (not shown) to which the package 100 is to be mounted. A heat sink 134 may be attached to the first metallization 126 at the first main side 104 of the insulating substrate 102 to provide double-sided cooling. The heat sink 134 may be omitted and instead the first metallization 126 thickened at the first main side 104 of the insulating substrate 102 to provide double-sided cooling. In the case of single-sided cooling, the heat sink 134 is omitted and therefore illustrated as a dashed box in FIG. 1. Any gaps 136 between the heat sink 134 and the first metallization 126 at the first main side 104 of the insulating substrate 102 may be filled with a thermal interface material such as thermal grease, thermal glue, etc. The gap(s) 136 instead may be eliminated by covering part of the first metallization 126 at the first main side 104 of the insulating substrate 102 and increasing the thickness of the first metallization 126 where uncovered, e.g., by additional plating and/or ECD (electrochemical deposition) of Cu.

A first solder mask 138 may at least partly cover the first metallization 126 at the first main side 104 of the insulating substrate 102. In the case of single-sided cooling, the first solder mask 138 may completely cover the first metallization 126 at the first main side 104 of the insulating substrate 102. A second solder mask 140 may be provided at the second main side 106 of the insulating substrate 102 to define the exposed surface area of the respective solderable contact pads 128, 130, 132 provided at the second main side 106 of the insulating substrate 102 for surface mounting of the semiconductor package 100.

Figure 2:
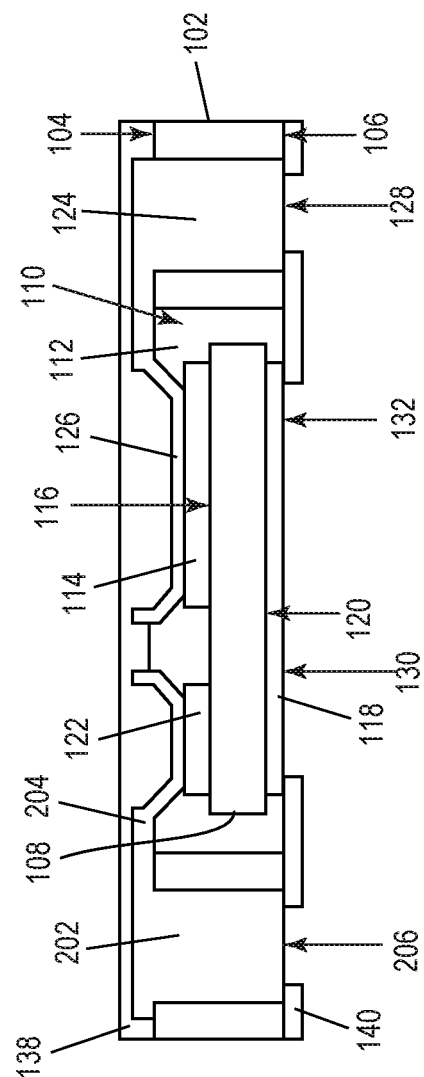
FIG. 2 illustrates a cross-sectional view of another embodiment of a semiconductor package.

FIG. 2 illustrates a cross-sectional view of another embodiment of a semiconductor package 200. The embodiment shown in FIG. 2 is similar to the embodiment shown in FIG. 1. Different, however, the control terminal bond pad 122 of the power semiconductor die 108 is at the first side 116 of the die 108 instead of the second side 120 in FIG. 2. To provide an electrical connection for the control terminal bond pad 122 of the power semiconductor die 108 at the second main side 106 of the insulating substrate 102, the semiconductor package 200 in FIG. 2 includes an electrically conductive second via 202 extending through the insulating substrate 102 in the periphery region and a second metallization 204 connecting the control terminal bond pad 122 of the power semiconductor die 108 to the second via 202 at the first main side 104 of the insulating substrate 102. The second metallization 204 at the first main side 104 of the insulating substrate 102 is separated from the first metallization 126 to prevent an electrical short between the control terminal bond pad 122 and the first load terminal bond pad 114 of the power semiconductor die 108.

A solderable third contact pad 206 at the second main side 106 of the insulating substrate 102 is formed by the second via 202. Hence only the second load terminal bond pad 118 at the second side 120 of the power semiconductor die 108 need comprise a solderable metal or metal compound such as Cu, whereas the control terminal bond pad 122 and the first load terminal bond pad 114 at the first side 116 of the power semiconductor die 108 may or may not comprise a solderable metal or metal compound. The first vias 124 and the second via 202 each comprise a solderable metal or metal compound such as Cu, and the second via 202 may have the same or similar composition as the first vias 124. The first solder mask 138 is shown covering the entire first main side 104 of the insulating substrate 102 in FIG. 2, but instead may only partly cover the first main side 104 of the insulating substrate 102 or may be omitted altogether, e.g., to enable double-sided cooling.

FIGS. 3A and 3B illustrate an embodiment of a method of producing the semiconductor package 100 shown in FIG. 1. In FIGS. 3A and 3B, the left-hand side of the respective figures shows a plan view of the first main side 104 of the insulating substrate 102 and the right-hand side of the respective figures shows a plan view of the second main side 106 of the insulating substrate 102.

FIG. 3A shows the semiconductor package 100 after embedding the power semiconductor die 108 in the insulating substrate 102 of the package 100, but before forming the first metallization 126 at the first main side 104 of the insulating substrate 102. As shown in FIG. 3A and as explained previously herein, solderable first contact pads 128 at the second main side 106 of the insulating substrate 102 are formed by the first vias 124, a solderable second contact pad 130 at the second main side 106 of the insulating substrate 102 is formed by the second load terminal bond pad 118 of the power semiconductor die 108, and a solderable third contact pad 132 at the second main side 106 of the insulating substrate 102 is formed by the control terminal bond pad 122 of the die 108.

Since the terminal bond pads 118, 122 at the second side 116 of the power semiconductor die 108 are solderable and used as final/direct pads 130, 132 for the semiconductor package 100 at the second main side 106 of the insulating substrate 102, the manufacturing method to produce the package 100 does not require additional processing/metallization layers to provide corresponding points of contact for the package 100. For example, deposition of a seed layer followed by plating of Cu on the terminal bond pads 118, 122 at the second side 116 of the power semiconductor die 108 may be eliminated as part of the package manufacturing process.

FIG. 3B shows the semiconductor package 100 after forming the first metallization 126 at the first main side 104 of the insulating substrate 102. The first metallization 126 is formed by forming the first solder mask 136 on the first main side 104 of the insulating substrate 102. The first solder mask 126 has one or more openings 300 which expose at least part of the first load terminal bond pad 114 at the first side 116 of the power semiconductor die 108 and exposes at least part of the first vias 124 which extend through the insulating substrate 102. Copper is then deposited in the opening(s) 300 of the first solder mask 126. The term 'copper' as used herein refers to Cu and Cu alloys. The first vias 124 and the first load terminal bond pad 114 at the first side 116 of the power semiconductor die 108 are illustrated as dashed boxes in the left-hand part of FIG. 3B, since the first vias 124 and the first load terminal bond pad 114 are covered by the first metallization 126 and therefore obstructed in the left-hand plan view of FIG. 3B.

The right-hand plan view of FIG. 3B shows the second side 106 of the insulating substrate 102 after a second solder mask 140 is provided at the second main side 106 of the insulating substrate 102. The second solder mask 140, if provided, defines the exposed surface area of the respective solderable contact pads 128, 130, 132 provided at the second main side 106 of the insulating substrate 102 for surface mounting of the semiconductor package 100, as previously explained herein.

FIGS. 4A and 4B illustrate an embodiment of a method of producing the semiconductor package 200 shown in FIG. 2. In FIGS. 4A and 4B, the left-hand side of the respective figures shows a plan view of the first main side 104 of the insulating substrate 102 and the right-hand side of the respective figures shows a plan view of the second main side 106 of the insulating substrate 102.

FIG. 4A shows the semiconductor package 200 after embedding the power semiconductor die 108 in the insulating substrate 102 of the package 200, but before forming the first metallization 126 at the first main side 104 of the insulating substrate 102. As shown in FIG. 4A and as explained previously herein, solderable first contact pads 128 at the second main side 106 of the insulating substrate 102 are formed by the first vias 124, a solderable second contact pad 130 at the second main side 106 of the insulating substrate 102 is formed by the second load terminal bond pad 118 of the power semiconductor die 108, and a solderable third contact pad 206 at the second main side 106 of the insulating substrate 102 is formed by the second via 202.

Since the second load terminal bond pad 118 at the second side 116 of the power semiconductor die 108 is solderable and used as a final/direct pad 130 for the semiconductor package 100 at the second main side 106 of the insulating substrate 102, the manufacturing method to produce the package 100 does not require additional processing/metallization layers to provide corresponding points of contact for the package 100. For example, as explained above, deposition of a seed layer followed by plating of Cu on the second load terminal bond pad 118 at the second side 116 of the power semiconductor die 108 may be eliminated as part of the package manufacturing process.

FIG. 4B shows the semiconductor package 200 after forming the first and second metallizations 126, 204 at the first main side 104 of the insulating substrate 102. The first metallization 126 connects the first load terminal bond pad 114 at the first side 116 of the power semiconductor die 108 to the first vias 124 at the first main side 104 of the insulating substrate 102 and the second metallization 204 connects the control terminal bond pad 122 of the power semiconductor die 108 at the first side 116 of the die 108 to the second via 202 at the first main side 104 of the insulating substrate 102, as previously explained herein.

The first and second metallizations 126, 204 are formed by forming the first solder mask 136 on the first main side 104 of the insulating substrate 102. The first solder mask 126 has a first opening 400 which exposes at least part of the first load terminal bond pad 114 at the first side 116 of the power semiconductor die 108 and exposes at least part of the first vias 124 which extend through the insulating substrate 102. The first solder mask 126 also has a second opening 402 which exposes at least part of the control terminal bond pad 122 at the first side 116 of the power semiconductor die 108 and exposes at least part of the second via 202 which extends through the insulating substrate 102. Copper is then deposited in the first and second openings 400, 402 of the first solder mask 126. The first vias 124 and the first load terminal bond pad 114 and the control terminal bond pad 122 at the first side 116 of the power semiconductor die 108 are illustrated as dashed boxes in the left-hand part of FIG. 3B, since the first vias 124 and the first load terminal bond pad 114 are covered by the first metallization 126 and the control terminal bond pad 122 is covered by the second metallization 204 and therefore obstructed in the left-hand plan view of FIG. 4B.

The right-hand plan view of FIG. 4B shows the second side 106 of the insulating substrate 102 after a second solder mask 140 is provided at the second main side 106 of the insulating substrate 102. The second solder mask 140, if provided, defines the exposed surface area of the respective solderable contact pads 128, 130, 206 provided at the second main side 106 of the insulating substrate 102 for surface mounting of the semiconductor package 200, as previously explained herein.

Figure 5:
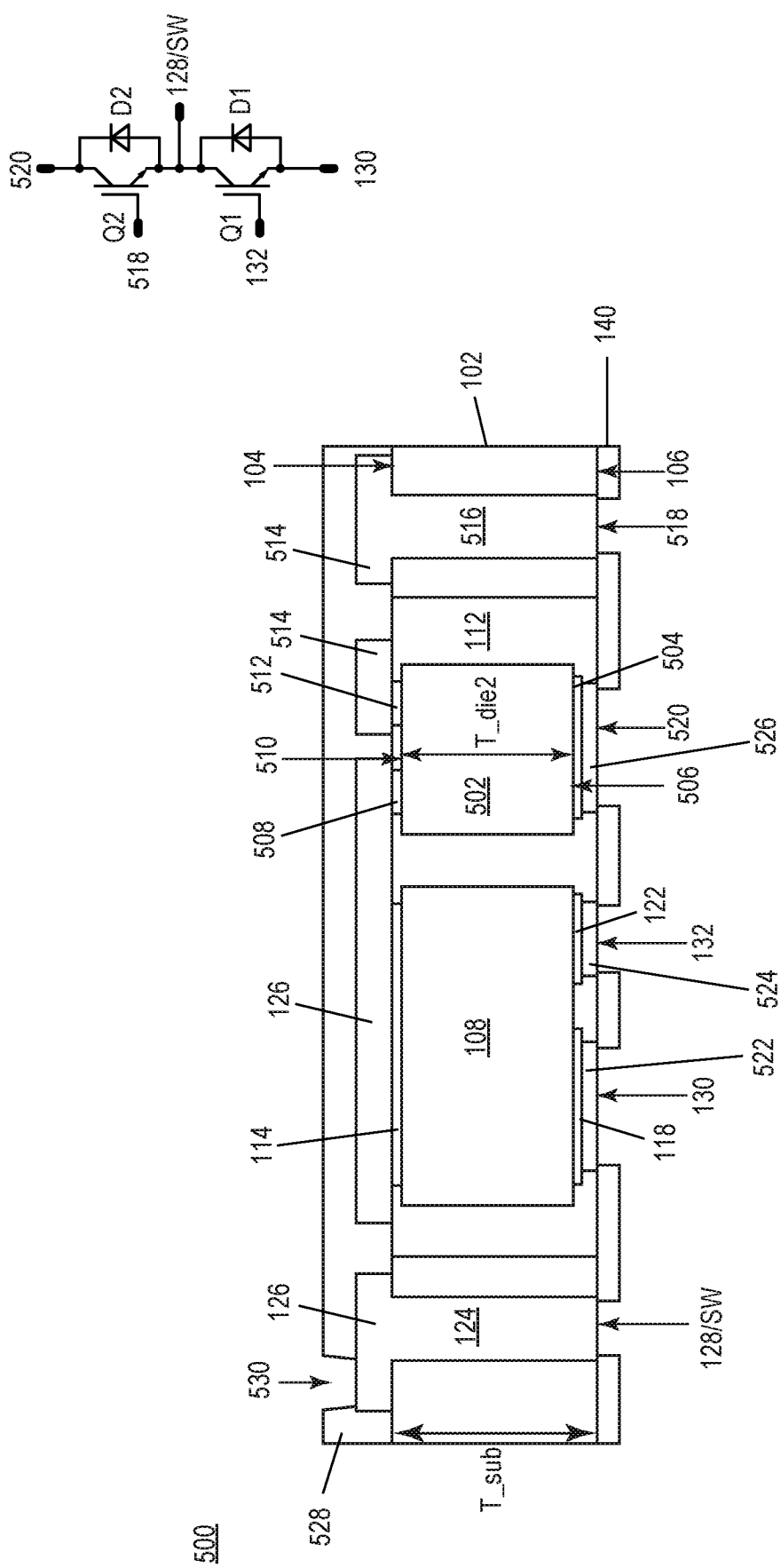
FIG. 5 illustrates a cross-sectional view of another embodiment of a semiconductor package.

FIG. 5 illustrates a cross-sectional view of another embodiment of a semiconductor package 500. The embodiment shown in FIG. 2 is similar to the embodiments shown in FIGS. 1 and 2. Different, however, the semiconductor package 500 in FIG. 5 also includes an additional power semiconductor die 502 embedded in, and thinner than (i.e. T_die2<T_sub) or a same thickness as (i.e. T_die2=T_sub), the insulating substrate 102. The additional power semiconductor die 502 has a first load terminal bond pad 504 at a side 506 of the additional die 502 which faces the same direction as the second main side 106 of the insulating substrate 102. The additional power semiconductor die 502 also has a second load terminal bond pad 508 at a side 510 of the additional die 502 which faces the same direction as the first main side 104 of the insulating substrate 102. The additional power semiconductor die 502 further has a control terminal bond pad 512 at either side 506, 510 of the additional die 502, although the control terminal bond pad 512 is at the second side 506 of the additional die 502 in FIG. 5 as an example.

In one embodiment, the first metallization 126 connects the first load terminal bond pad 114 of the (first) power semiconductor die 108 to the second load terminal bond pad 508 of the additional power semiconductor die 502 in a half bridge configuration at the first main side 104 of the insulating substrate 102. The upper right corner of FIG. 5 includes a circuit schematic of a half bridge circuit, where transistor Q1 corresponds to the first power semiconductor die 108 and transistor Q2 corresponds to the additional power semiconductor die 502. The switch node 'SW' formed by the coupled connection of the power semiconductor dies 108, 502 and formed by the first metallization 126 is brought to the second main side 106 of the insulating substrate by the first vias 124. The entire connection between the first metallization 126 and the first vias 124 is out of view in the cross-sectional view of FIG. 5. For duty cycles less than 50%, the additional power semiconductor die 502, which forms the high-side switch of the half bridge circuit, can be made smaller than the first power semiconductor die 108, which forms the high-side switch of the half bridge circuit, because the low-side switch is on for a longer period of the half bridge switching cycle than the high-side switch. The additional power semiconductor die 502 is shown as being smaller than the first power semiconductor die 108 in the cross-sectional view of FIG. 5 to emphasize this point. The diodes D1, D2 shown in the schematic view of FIG. 5 may be monolithically integrated in the corresponding dies 108, 502 or may be discrete components.

An additional metallization 514 at the first main side 106 of the insulating substrate 102 connects the control terminal bond pad 512 at the second side 510 of the additional power semiconductor die 502 to one or more corresponding additional electrically conductive vias 516 which extend through the insulating substrate 102. The entire connection between the additional metallization 514 and the additional via(s) 124 is out of view in the cross-sectional view of FIG. 5.

A solderable contact pad 518 is formed by the additional vias 516 at the second main side 106 of the insulating substrate 102. Another solderable contact pad 520 at the second main side 106 of the insulating substrate 102 is formed by the first load terminal bond pad 504 at the first side 506 of the additional power semiconductor die 502. This way, all electrical connections for the power semiconductor dies 108, 502 are provided at the second main side 106 of the insulating substrate 102 in the form of respective solderable contact pads 128, 130, 132, 518, 520, giving the semiconductor package 500 an SMD configuration. At least the solderable contact pads 130, 132, 520 formed by the respective terminal bond pads 118, 122, 504 of the power semiconductor dies 108, 502 may have an additional Cu plating 522, 524, 526 as shown in FIG. 5. Alternatively, the additional plating may be omitted as previously described herein.

An insulating layer 528 such as polyimide may be provided at the first main side 104 of the insulating substrate 102 to provide proper insulation at this side of the package 500, and may include one or more openings 530 which expose corresponding one or more of the metallizations 126, 514.

Figure 6A:
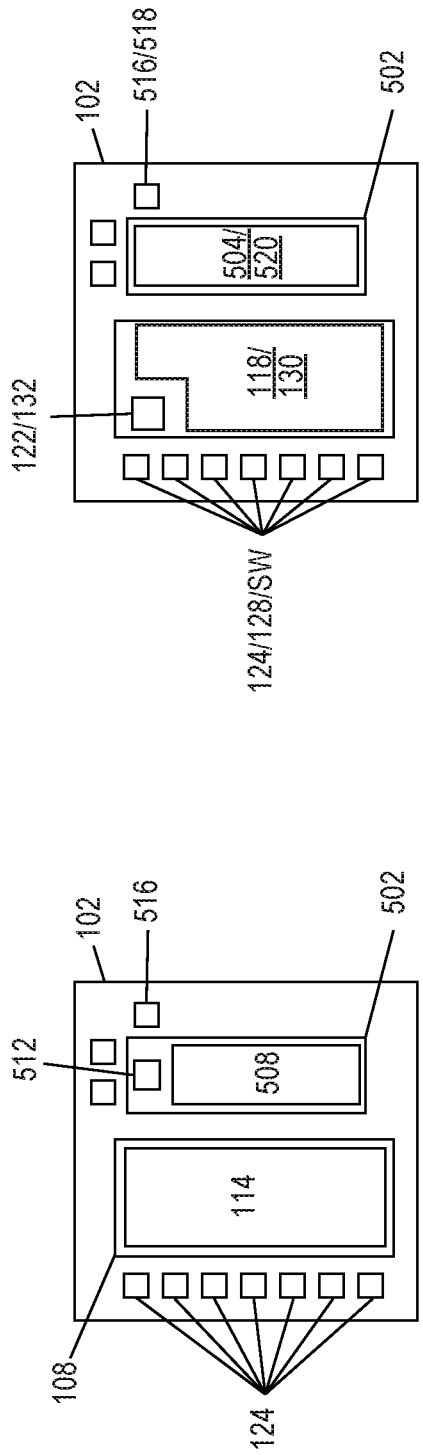
FIGS. 6A and 6B illustrate an embodiment of a method of producing the semiconductor package shown in FIG. 5.
Figure 6B:
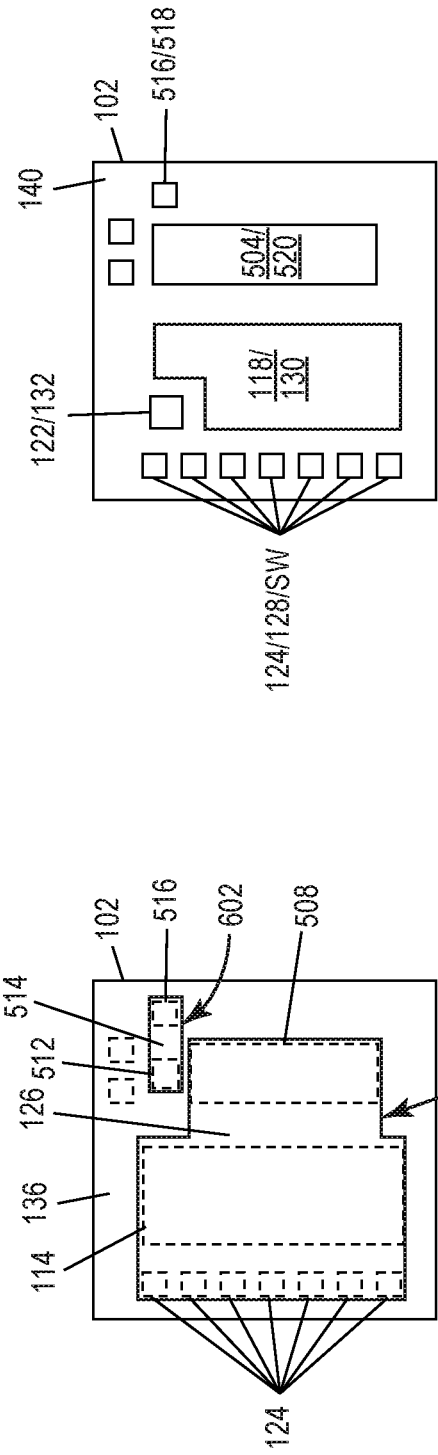

FIGS. 6A and 6B illustrate an embodiment of a method of producing the semiconductor package 500 shown in FIG. 5. In FIGS. 5A and 5B, the left-hand side of the respective figures shows a plan view of the first main side 104 of the insulating substrate 102 and the right-hand side of the respective figures shows a plan view of the second main side 106 of the insulating substrate 102.

FIG. 6A shows the semiconductor package 500 after embedding the power semiconductor dies 108, 502 in the insulating substrate 102 of the package 500, but before forming the metallizations 126, 514 at the first main side 104 of the insulating substrate 102. As shown in FIG. 6A and as explained previously herein, solderable first contact pads 128 for the half bridge switch node SW at the second main side 106 of the insulating substrate 102 are formed by the first vias 124, a solderable second contact pad 130 at the second main side 106 of the insulating substrate 102 is formed by the second load terminal bond pad 118 of the power semiconductor die 108, a solderable third contact pad 520 at the second main side 106 of the insulating substrate 102 is formed by the first load terminal bond pad 504 of the additional power semiconductor die 108, a solderable fourth contact pad 132 at the second main side 106 of the insulating substrate 102 is formed by the control terminal bond pad 122 of the first die 108, and a solderable fifth contact pad 518 at the second main side 106 of the insulating substrate 102 is formed by the corresponding additional via 516.

FIG. 6B shows the semiconductor package 500 after forming the metallizations 126, 514 at the first main side 104 of the insulating substrate 102. The first solder mask 136 is formed on the first main side 104 of the insulating substrate 102. The first solder mask 126 has a first opening 600 that defines the layout/footprint for the first metallization 126. The first opening 600 in the first solder mask 126 exposes at least part of the first load terminal bond pad 114 at the first side 116 of the first power semiconductor die 108, exposes at least part of the second load terminal bond pad 508 at the second side 510 of the additional power semiconductor die 108, and exposes at least part of the first vias 124 which extend through the insulating substrate 102.

The first solder mask 126 also has a second opening 602 that defines the layout/footprint for the second metallization 514. The second opening 602 in the first solder mask 126 exposes at least part of the control terminal bond pad 512 at the second side 510 of the additional power semiconductor die 502 and exposes at least part of the corresponding via 516 which extends through the insulating substrate 102.

Copper is then deposited in the openings 600, 602 of the first solder mask 126. The first vias 124, the first load terminal bond pad 114 at the first side 116 of the power semiconductor die 108, the second load terminal bond pad 508 at the second side 510 of the additional power semiconductor die 108, and the control terminal bond pad 510 at the second side 510 of the additional power semiconductor die 108 and corresponding via 516 are illustrated as dashed boxes in the left-hand part of FIG. 6B, since the vias 124, 516 and the terminal bond pads 114, 508, 512 are covered by the metallizations 126, 514 and therefore obstructed in the left-hand plan view of FIG. 6B.

The right-hand plan view of FIG. 6B shows the second side 106 of the insulating substrate 102 after a second solder mask 140 is provided at the second main side 106 of the insulating substrate 102. The second solder mask 140, if provided, defines the exposed surface area of the respective solderable contact pads 128, 130, 132, 518, 520 provided at the second main side 106 of the insulating substrate 102 for surface mounting of the semiconductor package 500, as previously explained herein.

FIGS. 7A through 7I illustrate respective cross-sectional views of an embodiment of a method of batch producing semiconductor packages of the kind previously described herein.

Figure 7A:
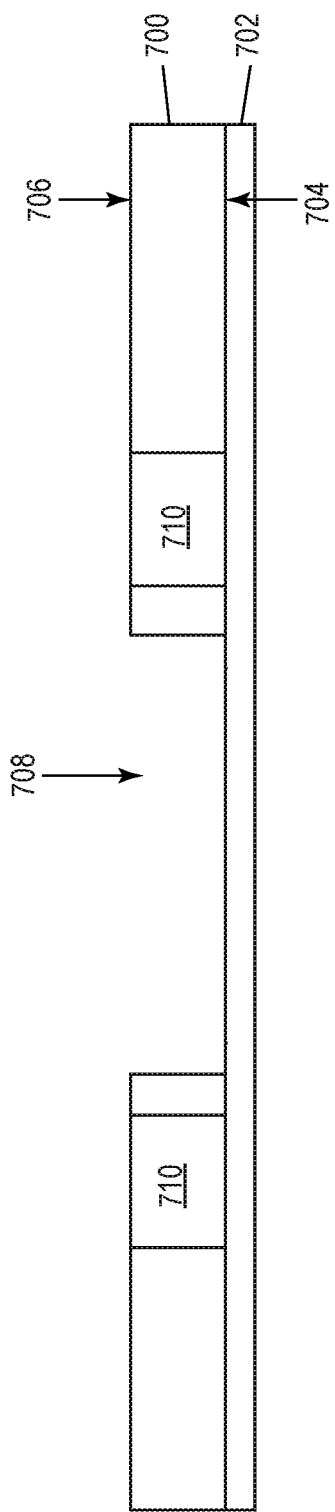

FIG. 7A shows a core insulating panel 700 adhered to a temporary bonding tape 702 at a second main side 704 of the core insulating panel 700 opposite a first main side 706. The core insulating panel 700 has a plurality of openings 708 each sized to receive a power semiconductor die. Only one opening 708 is shown in FIGS. 7A through 7I for ease of illustration. The core insulating panel 700 also has electrically conductive vias 710 which extend through the panel 700. The vias 710 are wide/large enough so that the vias 710 have sufficient surface contact area for use as final/direct pads at the second main side 704 of the panel 700. The core insulating panel 700 may be a laminate with the vias 710 embedded in the laminate as Cu blocks. In another example, the core insulating panel 700 may be a standard PCB laminate with the vias 710 being filled Cu vias. In yet another example, the core insulating panel 700 may be a molded panel with the vias 710 being embedded Cu vias, blocks, leaframe components, etc. The vias 710 in FIG. 7A may correspond to any of the vias 124, 202, 516 shown in FIGS. 1 through 6B.

Figure 7B:
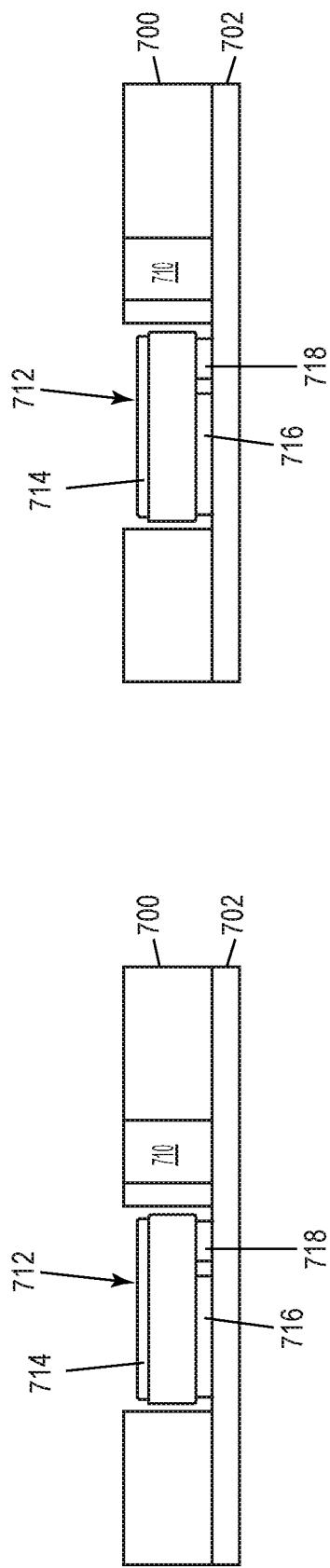

FIG. 7B shows a power semiconductor die 712 inserted in each opening 708 of the core insulating panel 700. Each power semiconductor die 712 is thinner than or a same thickness as the core insulating panel 700 and includes a first load terminal bond pad 714 at a first side which faces the same direction as the first main side 706 of the core insulating panel 700, a second load terminal bond pad 716 at a second side which faces the same direction as the second main side 704 of the core insulating panel 700, and a control terminal bond pad 718 at the first side or the second side of the die 712. The left-hand side of FIG. 7B shows the control terminal bond pad 718 at the side of the die 712 facing the temporary bonding tape 702 (e.g. source-up configuration), and the right-hand side of FIG. 7B shows the control terminal bond pad 718 at the side of the die 712 facing away from the temporary bonding tape 702 (e.g. source-down configuration). In either case, each power semiconductor die 712 is adhered to the temporary bonding tape 702 at the side of the die 712 facing the tape 702.

Figure 7C:
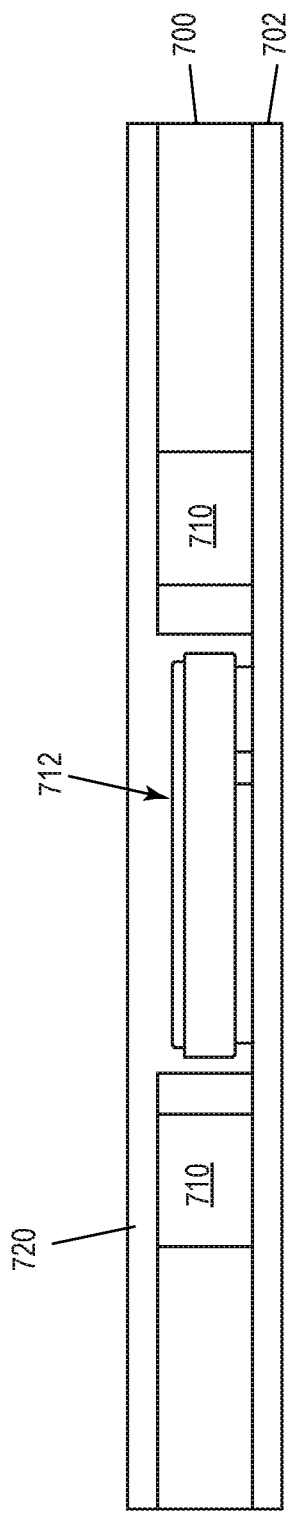

FIG. 7C shows, after inserting a power semiconductor die 712 in each opening 708 of the core insulating panel 700, filling each opening 708 and covering each power semiconductor die 712 with a resin film 720. Any standard resin film lamination process may be used.

Figure 7D:
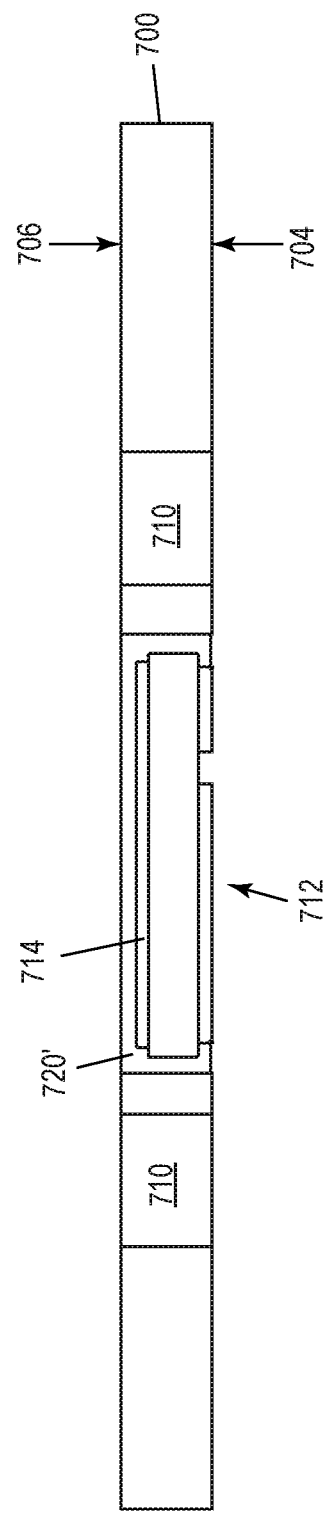

FIG. 7D shows, after filling each opening 708 and covering each power semiconductor die 712 with the resin film 720, removing the temporary bonding tape 702 and planarizing the resin film 720 at the first main side 706 of the core insulating panel 700. Standard planarization techniques may be used such as CMP (chemical-mechanical polishing).

FIG. 7E shows removing the resin film 720' from at least part of the first load terminal bond pad 714 at the side of each power semiconductor die 712 which faces the same direction as the first main side 706 of the core insulating layer 700. In one embodiment, the resin part 720" which remains after exposing the first load terminal bond pad 714 of each power semiconductor die 712 is the insulating material 112 shown in FIGS. 1, 2 and 5.

FIG. 7F forming a seed layer 722 for Cu growth on the first main side 706 of the core insulating panel 700 and on the part of the first load terminal bond pad 714 of each power semiconductor die 712 exposed by removing the resin film 720'. For example, the seed layer 722 may be sputtered on the first main side 706 of the core insulating panel 700 and on the exposed part of the first load terminal bond pad 714 of each power semiconductor die 712.

FIG. 7G shows plating copper 724 on the seed layer 722. Any standard Cu plating process may be used such as ECD.

FIG. 7H shows patterning the plated copper 724 to define at least a first metallization 726. For example, the plated copper 724 may be pattered to define any of the metallizations 126, 204, 514 shown in FIGS. 1 through 6B. Any standard patterning processes such as lithography and etching may be used to pattern the plated copper 724.

Figure 7I:
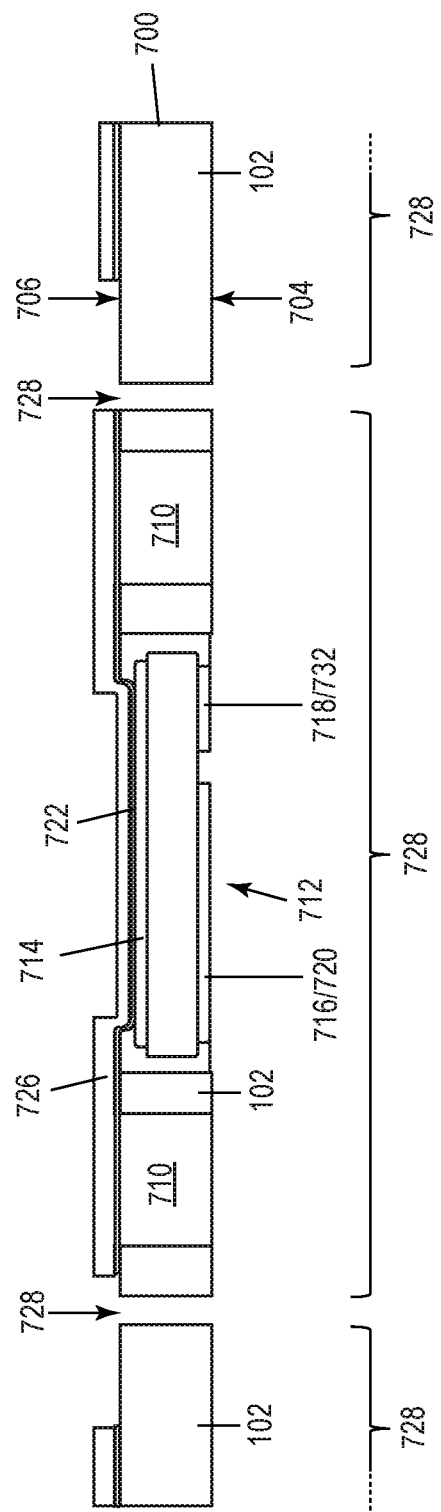

FIG. 7I shows singulating the core insulating panel 700 into separate (individual) packages 728. The core insulating panel 700 may be singulated along dicing/kerf zones 730 to form the separate packages 728 using any standard singulation process such as sawing, laser cutting, etc. One or more solder masks (not shown in FIG. 7I) may also be formed, e.g., as previously described herein.

The individual packages 728 in FIG. 7I may correspond to any of the packages 100, 200, 500 shown in FIGS. 1, 2 and 5. That is, a singulated section of the core insulating panel 700 may correspond to the insulating substrate 102 shown in FIGS. 1 through 6B. Also, the second load terminal bond pad 716 at the side of each die 712 which faces the same direction as the second main side 704 of the singulated core insulating panel 700 forms a solderable contact pad 730 at the second main side 704 of the singulated core insulating panel 700. For the source-up configuration shown in the left-hand side of FIG. 7B, the control terminal bond pad 718 of each die 712 likewise forms a solderable contact pad 732 at the second main side 704 of the singulated core insulating panel 700 as shown in FIG. 7I and similar to what is shown in FIG. 1. For the drain-up configuration shown in the right-hand side of FIG. 7B, the control terminal bond pad 718 is at the other side of the die 712 similar to what is shown in FIG. 2.

Figure 8:
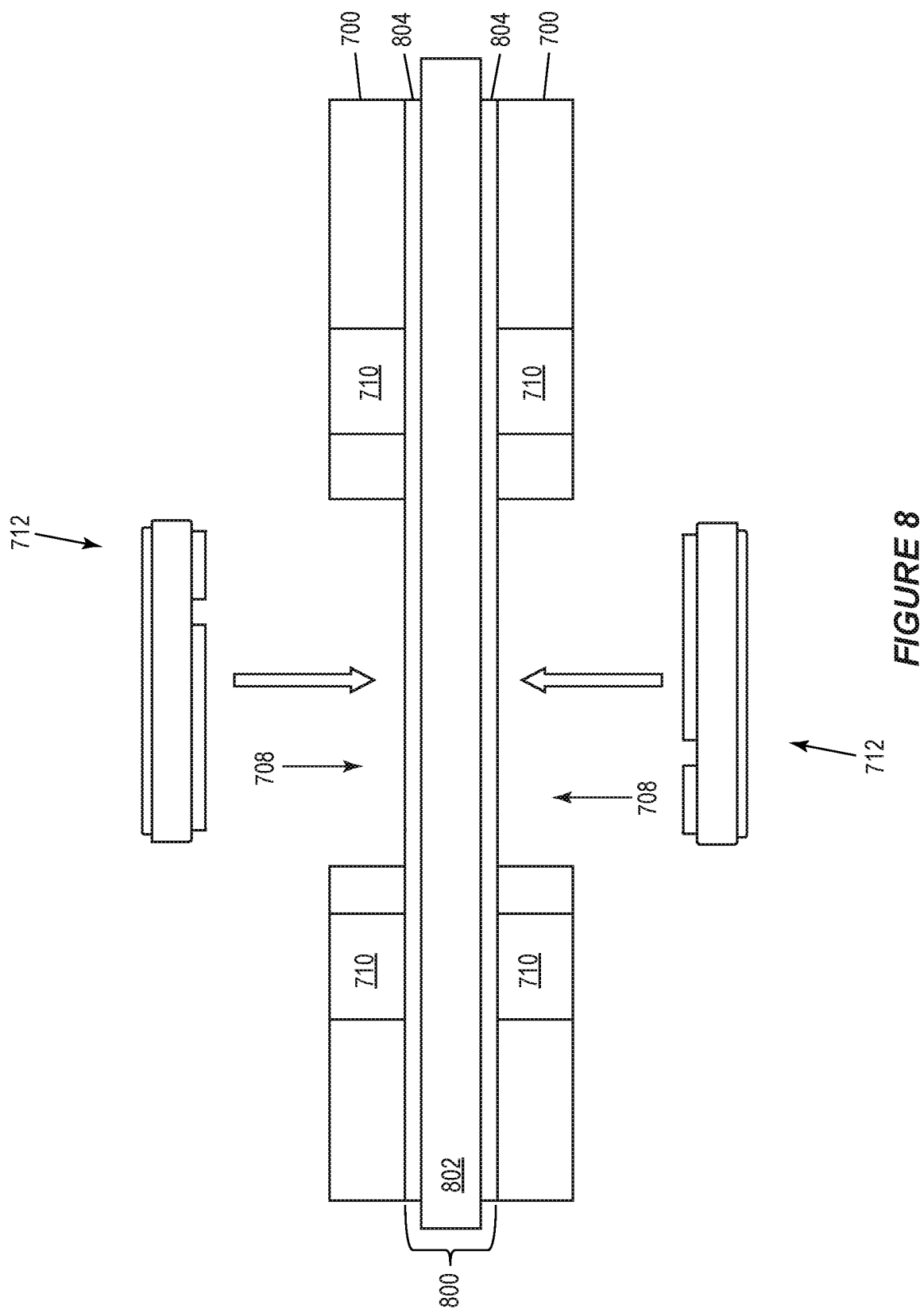
FIG. 8 illustrates a cross-sectional view of another embodiment of a method of batch producing semiconductor packages.

FIG. 8 illustrates a cross-sectional view of another embodiment of a method of batch producing semiconductor packages of the kind previously described herein. According to this embodiment, two core insulating panels 700 of the kind previously described herein in connection with FIGS. 7A through 7I are vertically stacked on one another to improve processability and throughput. The core insulating panels 700 may be stacked using a double-sided release tape, temporary glue/wax, or other type of temporary carrier structure 800 such as a carrier 802 interposed between two temporary bonding tapes 804. The core insulating panels 700 instead may be clamped together under a vacuum, with a jig, screw, etc. before die placement, or by lamination, sputtering, plating, etc. Power semiconductor dies 712 are inserted in the openings 708 in both core insulating panels 700 as shown in FIG. 8, and then processing of both panels 700 continues as shown in FIGS. 7C through 7I.

Although the present disclosure is not so limited, the following numbered examples demonstrate one or more aspects of the disclosure.

Example 1

A semiconductor package, comprising: an insulating substrate having a first main side and a second main side opposite the first main side; a power semiconductor die embedded in, and thinner than or a same thickness as, the insulating substrate, the power semiconductor die comprising a first load terminal bond pad at a first side which faces a same direction as the first main side of the insulating substrate, a second load terminal bond pad at a second side which faces a same direction as the second main side of the insulating substrate, and a control terminal bond pad at the first side or the second side; electrically conductive first vias extending through the insulating substrate in a periphery region which laterally surrounds the power semiconductor die; a first metallization connecting the first load terminal bond pad of the power semiconductor die to the first vias at the first main side of the insulating substrate; solderable first contact pads at the second main side of the insulating substrate and formed by the first vias; and a solderable second contact pad at the second main side of the insulating substrate and formed by the second load terminal bond pad of the power semiconductor die.

Example 2

The semiconductor package of example 1, wherein the control terminal bond pad is at the second side of the power semiconductor die, the semiconductor package further comprising: a solderable third contact pad at the second main side of the insulating substrate and formed by the control terminal bond pad of the power semiconductor die.

Example 3

The semiconductor package of example 1, wherein the control terminal bond pad is at the first side of the power semiconductor die, the semiconductor package further comprising: an electrically conductive second via extending through the insulating substrate in the periphery region; a second metallization connecting the control terminal bond pad of the power semiconductor die to the second via at the first main side of the insulating substrate; and a solderable third contact pad at the second main side of the insulating substrate and formed by the second via.

Example 4

The semiconductor package of any of examples 1 through 3, wherein the insulating substrate comprises a first material in which the power semiconductor die is embedded and a second material different than the first material and which forms the periphery region.

Example 5

The semiconductor package of any of examples 1 through 4, wherein the first vias, the first metallization, and the first load terminal bond pad of the power semiconductor die each comprise copper.

Example 6

The semiconductor package of any of examples 1 through 3, wherein the solderable second contact pad is coplanar with the solderable first contact pads at the second main side of the insulating substrate.

Example 7

The semiconductor package of any of examples 1 through 3, further comprising: a solder mask at least partly covering the first metallization at the first main side of the insulating substrate.

Example 8

The semiconductor package of example 7, wherein the solder mask covers the entire first main side of the insulating substrate.

Example 9

The semiconductor package of any of examples 1 through 3, further comprising: a heat sink attached to the first metallization at the first main side of the insulating substrate.

Example 10

The semiconductor package of any of examples 1 through 3, further comprising: an additional power semiconductor die embedded in, and thinner than or a same thickness as, the insulating substrate, the additional power semiconductor die comprising a first load terminal bond pad at a first side which faces a same direction as the second main side of the insulating substrate, a second load terminal bond pad at a second side which faces a same direction as the first main side of the insulating substrate, and a control terminal bond pad at the first side or the second side; and a solderable additional contact pad at the second main side of the insulating substrate and formed by the first load terminal bond pad of the additional power semiconductor die, wherein the first metallization connects the first load terminal bond pad of the power semiconductor die to the second load terminal bond pad of the additional power semiconductor die in a half bridge configuration at the first main side of the insulating substrate.

Example 11

A method of producing a semiconductor package, the method comprising: embedding a power semiconductor die in an insulating substrate, the insulating substrate having a first main side and a second main side opposite the first main side, the power semiconductor die being thinner than or a same thickness as the insulating substrate and comprising a first load terminal bond pad at a first side which faces a same direction as the first main side of the insulating substrate, a second load terminal bond pad at a second side which faces a same direction as the second main side of the insulating substrate, and a control terminal bond pad at the first side or the second side; and forming a first metallization at the first main side of the insulating substrate, the first metallization connecting the first load terminal bond pad of the power semiconductor die to electrically conductive first vias which extend through the insulating substrate in a periphery region which laterally surrounds the power semiconductor die, wherein the first vias form solderable first contact pads at the second main side of the insulating substrate, wherein the second load terminal bond pad of the power semiconductor die forms a solderable second contact pad at the second main side of the insulating substrate.

Example 12

The method of example 11, wherein forming the first metallization comprises: forming a solder mask on the first main side of the insulating substrate, the solder mask having an opening which exposes at least part of the first load terminal bond pad of the power semiconductor die and exposes at least part of the first vias; and depositing copper in the opening of the solder mask.

Example 13

The method of example 12, wherein the control terminal bond pad is at the second side of the power semiconductor die, and wherein the control terminal bond pad of the power semiconductor die forms a solderable third contact pad at the second main side of the insulating substrate.

Example 14

The method of example 12, wherein the control terminal bond pad is at the first side of the power semiconductor die, wherein an electrically conductive second via extends through the insulating substrate in the periphery region and forms a solderable third contact pad at the second main side of the insulating substrate, the method further comprising: forming a second metallization at the first main side of the insulating substrate, the second metallization connecting the control terminal bond pad of the power semiconductor die to the second via at the first main side of the insulating substrate.

Example 15

The method of any of examples 11 through 14, further comprising: embedding an additional power semiconductor die in the insulating substrate, the additional power semiconductor die being thinner than or a same thickness as the insulating substrate and comprising a first load terminal bond pad at a first side which faces a same direction as the second main side of the insulating substrate, a second load terminal bond pad at a second side which faces a same direction as the first main side of the insulating substrate, and a control terminal bond pad at the first side or the second side, wherein the first load terminal bond pad of the additional power semiconductor die forms a solderable additional contact pad at the second main side of the insulating substrate, wherein the first metallization connects the first load terminal bond pad of the power semiconductor die to the second load terminal bond pad of the additional power semiconductor die in a half bridge configuration at the first main side of the insulating substrate.

Example 16

The method of any of examples 11 through 15, wherein embedding the power semiconductor die in the insulating substrate comprises: adhering the insulating substrate to a temporary bonding tape at the second main side of the insulating substrate; inserting the power semiconductor die in an opening of the insulating substrate such that the power semiconductor die adheres to the temporary bonding tape at the second side of the power semiconductor die; and after inserting the power semiconductor die in the opening of the insulating substrate, filling the opening and covering the power semiconductor die with a resin film.

Example 17

The method of example 16, further comprising: after filling the opening and covering the power semiconductor die with the resin film, removing the temporary bonding tape; planarizing the resin film at the first main side of the insulating substrate; and removing the resin film from at least part of the first load terminal bond pad at the first side of the power semiconductor die.

Example 18

The method of example 17, wherein forming the first metallization at the first main side of the insulating substrate comprises: forming a seed layer on the first main side of the insulating substrate and on the part of the first load terminal bond pad of the power semiconductor die exposed by removing the resin film; plating copper on the seed layer; and patterning the plated copper to define the first metallization.

Example 19

The method of any of examples 11 through 18, further comprising: adhering an additional insulating substrate to an opposite side of the temporary bonding tape as the insulating substrate, or to a temporary carrier interposed between the insulating substrate and the additional insulating substrate; inserting an additional power semiconductor die in an opening of the additional insulating substrate such that the additional power semiconductor die adheres to the temporary bonding tape or to the temporary carrier; and after inserting the additional power semiconductor die in the opening of the additional insulating substrate, filling the opening of the additional insulating substrate and covering the additional power semiconductor die with an additional resin film.

Example 20

A method of producing a plurality of semiconductor packages, the method comprising: adhering a core insulating panel having a plurality of openings to a temporary bonding tape at a second main side of the core insulating panel opposite a first main side; inserting a power semiconductor die in each opening of the core insulating panel, each power semiconductor die being thinner than or a same thickness as the core insulating panel and comprising a first load terminal bond pad at a first side which faces a same direction as the first main side of the core insulating panel, a second load terminal bond pad at a second side which faces a same direction as the second main side of the core insulating panel, and a control terminal bond pad at the first side or the second side, wherein each power semiconductor die adheres to the temporary bonding tape at the second side of the power semiconductor die; forming a first metallization layer at the first main side of the core insulating panel, the first metallization layer being patterned into a plurality of first metallizations, each first metallization being associated with one of the power semiconductor dies and connecting the first load terminal bond pad of the power semiconductor die to respective electrically conductive first vias which extend through the core insulating panel in a periphery region which laterally surrounds the power semiconductor die; and singulating the core insulating panel into a plurality of packages, wherein for each package the first vias included in the package form solderable first contact pads at the second main side of the singulated core insulating panel and the second load terminal bond pad of the power semiconductor die included in the package forms a solderable second contact pad at the second main side of the singulated core insulating panel.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
an insulating substrate having a first main side and a second main side opposite the first main side;
a power semiconductor die embedded in, and thinner than or a same thickness as, the insulating substrate, the power semiconductor die comprising a first load terminal bond pad at a first side which faces a same direction as the first main side of the insulating substrate, a second load terminal bond pad at a second side which faces a same direction as the second main side of the insulating substrate, and a control terminal bond pad at the first side or the second side;
electrically conductive first vias extending through the insulating substrate in a periphery region which laterally surrounds the power semiconductor die;
a first metallization connecting the first load terminal bond pad of the power semiconductor die to the first vias at the first main side of the insulating substrate;
solderable first contact pads at the second main side of the insulating substrate and formed by the first vias; and
a solderable second contact pad at the second main side of the insulating substrate and formed by the second load terminal bond pad of the power semiconductor die,
wherein the second main side of the insulating substrate and the solderable second contact pad are coplanar with the solderable first contact pads.

2. The semiconductor package of claim 1, wherein the control terminal bond pad is at the second side of the power semiconductor die, the semiconductor package further comprising:
a solderable third contact pad at the second main side of the insulating substrate and formed by the control terminal bond pad of the power semiconductor die.

3. The semiconductor package of claim 1, wherein the control terminal bond pad is at the first side of the power semiconductor die, the semiconductor package further comprising:
an electrically conductive second via extending through the insulating substrate in the periphery region;
a second metallization connecting the control terminal bond pad of the power semiconductor die to the second via at the first main side of the insulating substrate; and
a solderable third contact pad at the second main side of the insulating substrate and formed by the second via.

4. The semiconductor package of claim 1, wherein the insulating substrate comprises a first material in which the power semiconductor die is embedded and a second material different than the first material and which forms the periphery region.

5. The semiconductor package of claim 1, wherein the first vias, the first metallization, and the first load terminal bond pad of the power semiconductor die each comprise copper.

6. The semiconductor package of claim 1, wherein the solderable second contact pad is coplanar with the solderable first contact pads at the second main side of the insulating substrate.

7. The semiconductor package of claim 1, further comprising:
a solder mask at least partly covering the first metallization at the first main side of the insulating substrate.

8. The semiconductor package of claim 7, wherein the solder mask covers the entire first main side of the insulating substrate.

9. The semiconductor package of claim 1, further comprising:
a heat sink attached to the first metallization at the first main side of the insulating substrate.

10. The semiconductor package of claim 1, further comprising:
an additional power semiconductor die embedded in, and thinner than or a same thickness as, the insulating substrate, the additional power semiconductor die comprising a first load terminal bond pad at a first side which faces a same direction as the second main side of the insulating substrate, a second load terminal bond pad at a second side which faces a same direction as the first main side of the insulating substrate, and a control terminal bond pad at the first side or the second side; and
a solderable additional contact pad at the second main side of the insulating substrate and formed by the first load terminal bond pad of the additional power semiconductor die,
wherein the first metallization connects the first load terminal bond pad of the power semiconductor die to the second load terminal bond pad of the additional power semiconductor die in a half bridge configuration at the first main side of the insulating substrate.

11. The semiconductor package of claim 1, wherein the power semiconductor die is disposed within an opening in the insulating substrate, and wherein the opening is at least partly filled with an insulating material.

12. The semiconductor package of claim 11, wherein the insulating material comprises an epoxy or a resin.

13. The semiconductor package of claim 11, wherein the insulating material comprises a different material as material which forms the insulating substrate.

14. The semiconductor package of claim 13, wherein the material which forms the insulating substrate is glass fiber.

15. The semiconductor package of claim 1, wherein the solderable first and second contact pads each comprise any one or more of: Sn, Pb, Sb, Bi, Ag, Cu, Zn, and In.

16. The semiconductor package of claim 1, wherein the first load terminal bond pad of the semiconductor die comprises Cu or NiPdAu.

17. The semiconductor package of claim 1, further comprising a solderable third contact pad at the second main side of the insulating substrate and formed by the control terminal bond pad of the power semiconductor die, wherein the solderable third contact pad is coplanar with the second main side of the insulating substrate.

* * * * *